United States Patent [19]
Hirota et al.

[11] Patent Number: 6,146,966
[45] Date of Patent: Nov. 14, 2000

[54] PROCESS FOR FORMING A CAPACITOR INCORPORATED IN A SEMICONDUCTOR DEVICE

[75] Inventors: Toshiyuki Hirota; Hirohito Watanabe; Fumiki Aiso; Shuji Fujiwara; Masanobu Zenke, all of Tokyo, Japan

[73] Assignee: NEC Corporation, Tokyo, Japan

[21] Appl. No.: 08/859,210

[22] Filed: May 20, 1997

[30] Foreign Application Priority Data

May 21, 1996 [JP] Japan .................................. 8-125698

[51] Int. Cl.⁷ .............................................. H01L 21/8242
[52] U.S. Cl. ........................ 438/398; 438/253; 438/255; 438/396
[58] Field of Search .................................... 438/255, 398, 438/253, 254, 396, 397

[56] References Cited

U.S. PATENT DOCUMENTS

| | | | |
|---|---|---|---|
| 5,385,863 | 1/1995 | Tatsumi et al. | 438/398 |
| 5,691,228 | 11/1997 | Ping et al. | 438/255 |
| 5,721,171 | 2/1998 | Ping et al. | 438/398 |
| 5,759,262 | 6/1998 | Weimer et al. | 439/398 |
| 5,770,500 | 6/1998 | Batra et al. | 438/398 |

FOREIGN PATENT DOCUMENTS

| | | |
|---|---|---|
| 5-110023 | 4/1991 | Japan . |
| 5-315543 | 11/1993 | Japan . |
| 7-14797 | 1/1995 | Japan . |

OTHER PUBLICATIONS

British Search Report, dated Jul. 30, 1997.

*Primary Examiner*—Carl Whitehead, Jr.
*Assistant Examiner*—Toniae M. Thomas
*Attorney, Agent, or Firm*—McGuireWoods LLP

[57] ABSTRACT

In a process of forming hemi-spherical silicon grains on an amorphous silicon film in accordance with the "crystal nucleation" process, in order to form crystal nuclei on a top surface and a side surface of the amorphous silicon film, $SiH_4$ is irradiated onto the top and side surfaces of the amorphous silicon film at a stabilized temperature which is lower than, by at least 5° C., an annealing temperature for growing the hemi-spherical silicon grains from the crystal nuclei, with the result that it is possible to suppress or retard the growth of the crystals growing into the amorphous silicon film from a boundary between the amorphous silicon film and an interlayer insulator film. Thereafter, the amorphous silicon film having the crystal nuclei thus formed on the surface thereof is annealed at the annealing temperature so that the hemi-spherical silicon grains are formed on the whole surface of the top and side surfaces of the amorphous silicon film.

6 Claims, 5 Drawing Sheets

PROCESS FOR FORMING A CAPACITOR INCORPORATED IN A SEMICONDUCTOR DEVICE

BACKGROUND OF THE INVENTION

1. Field of the Invention

The present invention relates to a process for manufacturing a semiconductor device, and more specifically to a process for forming a capacitor incorporated in a semiconductor device.

2. Description of Related Art

At present, in semiconductor devices of this type having capacitors, a high integration density is demanded, as can be seen in DRAM (dynamic random access memory). In order to fulfill this demand, an area required for each memory cell in the DRAM has been extremely reduced. For example, in a 1MDRAM or 4MDRAM, a 0.8 μm rule has been adopted in the semiconductor device design, and further, in a 16MDRAM, a 0.6 μm rule has been adopted.

As mentioned above, the integration density is increased more and more, namely, a memory capacity is increased more and more in a semiconductor memory. However, in order to elevate the production efficiency and to lower a production cost, it is not allowed to increase the size of a semiconductor device chip. Because of this, how small a memory cell is formed, is an important problem to be solved on the semiconductor device.

However, if the area of the memory cell is reduced, the amount of electric charges stored in the memory cell correspondingly become small. Therefore, it has become difficult to realize a high integration density of memory cells and at the same time to ensure a necessary amount of electric charge stored in each memory cell.

Under the above mentioned circumstance, a memory cell having a trench capacitor and a memory cell having a stacked capacitor have been proposed and reduced in practice.

As compared with the memory cell having the trench capacitor, the memory cell having the stacked capacitor has an excellent soft-error resistance and an advantage in which no damage is given to a silicon substrate. Therefore, the stacked capacitor type memory cell is expected as next generation memory cell structure.

As the stacked capacitor, there is proposed a stacked capacitor formed by utilizing a HSG (hemi-spherical grain) technology. This type of stacked capacitor is constituted of a capacitor lower plate (storage node capacitor cell plate), a capacitor insulator film and a capacitor upper plate (common plate), the capacitor lower plate being electrically connected through a contact hole formed in an interlayer insulator film, to a MOSFET (metal-oxide-semiconductor field effect transistor) formed in a semiconductor substrate. In this case, a number of hemi-spherical grains are formed on a surface of storage electrode (capacitor lower plate), so that a surface area of the storage electrode is substantially increased, with the result that an increased capacitance is realized.

As one example of the HSG technology for forming concaves and convexes by hemi-spherical grains, Japan Patent Application Pre-examination Publication No. JP-A-5-110023 (an English abstract of which is available from the Japanese Patent Office and is incorporated by reference in its entirety into this application) proposes to deposit an amorphous silicon film through a natural oxide film on a silicon film, and to conduct a heat treatment to cause migration in a surface of the amorphous silicon film, so that a surface-roughed polysilicon film having a concave-convex upper surface is formed.

This JP-A-5-110023 is so featured in that the formation of the concaves and convexes formed by the HSG technology is limited to only a top surface of the polysilicon film, and therefore, the increase of the capacitance inevitably has certain limit.

On the other hand, Japanese Patent Application Pre-examination Publication No. JP-A-5-315543 (an English abstract of which is available from the Japanese Patent Office and is incorporated by reference in its entirety into this application) proposes a process for forming, by the HSG technology, concaves and convexes not only on a top surface of a capacitor lower plate but also on a side surface of the capacitor lower plate. In this proposed process, after an amorphous silicon film deposited by a CVD (chemical vapor deposition) process is patterned by a selective etching, the patterned amorphous silicon film is heat-treated in an inert gas or vacuum atmosphere, so that the amorphous silicon film is crystallized into a polysilicon film. According to this process, since the concaves and convexes are formed not only on the top surface of the capacitor lower plate but also on the side surface of the capacitor lower plate, a large capacitance can be advantageously obtained.

However, the experiments conducted by the co-inventors of the present application showed that, in the process disclosed by JP-A-5-315543, the processing temperature for growing the hemi-spherical silicon crystalline grains is as narrow as ±2.5° C. Therefore, this process is not suitable to a mass production.

In order to eliminate this disadvantage, a so called a "crystal nucleation" has been proposed in which $SiH_4$ or the like is irradiated to the top surface and the side surface of the amorphous silicon to form nuclei on these surfaces, and then, an annealing is conducted to form the concaves and convexes on the top surface and the side surface of the amorphous silicon. More specifically, in this "crystal nucleation", an amorphous silicon film is formed to electrically connect to a semiconductor device element such as a MOSFET formed in a semiconductor substrate, through a contact hole selectively formed through an interlayer insulator film, and the amorphous silicon film is patterned to form a capacitor lower plate. A natural oxide film remaining on a surface of the capacitor lower plate is removed by use of HF of the like, and thereafter, $SiH_4$ is irradiated onto the capacitor lower plate within a reaction chamber which is maintained at a predetermined temperature. After irradiation of $SiH_4$, an annealing is conducted for a predetermined length of time. Thus, there is obtained the capacitor lower plate having the concaves and convexes formed on not only the top surface but also the side surface in accordance with the HSG technology.

In the above mentioned "crystal nucleation" process, however, it was observed that, a crystal grows from a boundary between the capacitor lower plate film and the interlayer insulator film, and this crystallization reaches to the exposed top surface and the exposed side surface of the capacitor lower plate before the concaves and convexes are formed on the top surface and the side surface of the capacitor lower plate. If the crystallization reaches to the top surface and the side surface, the HSG formation process no longer advances, with the result that an expected increase of the surface area of the capacitor lower plate cannot be obtained. Actually, in the same wafer, some memory chips can obtain an expected increase of the surface area of the capacitor lower plate, but other memory chips cannot obtain the expected increase of the surface area of the capacitor lower plate, with the result that the production yield is low.

SUMMARY OF THE INVENTION

Accordingly, it is an object of the present invention to provide a process for manufacturing a semiconductor device, which has overcome the above mentioned defect of the conventional one.

Another object of the present invention is to provide a process for manufacturing a semiconductor device, which can minimize, in the "crystal nucleation" process, a crystallization occurring from a boundary between an amorphous semiconductor film and an interlayer insulator film in contact therewith.

Still another object of the present invention is to provide a process for forming a capacitor incorporated in a semiconductor device, which has a capacitor lower plate having an increased surface area.

The above and other objects of the present invention are achieved in accordance with the present invention by a process of irradiating a crystal nucleus forming gas onto an amorphous silicon film formed on an interlayer insulator film, at a first temperature, for forming crystal nuclei on a surface of the amorphous silicon film, and annealing the amorphous silicon film having the crystal nuclei thus formed on the surface thereof, at a second temperature, for forming hemi-spherical silicon grains on the surface of the amorphous silicon film, the improvement being characterized in that the first temperature is lower than the second temperature.

Specifically, the second temperature is not higher than 600° C., and the first temperature is not lower than 530° C. and is lower than the second temperature by not less than 5° C.

According to another aspect of the present invention, there is provided a process for forming a capacitor which is formed on an interlayer insulator film and which is electrically connected to a semiconductor substrate through a contact hole formed through the interlayer insulator film, the process comprising the steps of forming a patterned amorphous silicon film to fill the contact hole and to partially cover the interlayer insulator film, irradiating a crystal nucleus forming gas onto the patterned amorphous silicon film at a temperature which makes a growth rate of crystals growing from a boundary between the patterned amorphous silicon film and the interlayer insulator film, lower than that in a succeeding annealing step, so that crystal nuclei are formed on a surface of the patterned amorphous silicon film, annealing the patterned amorphous silicon film so that hemi-spherical silicon grains are formed from the crystal nuclei on the surface of the patterned amorphous silicon film, forming a capacitor dielectric film to cover the hemi-spherical silicon grains, and forming a capacitor plate to cover the capacitor dielectric film, so that a capacitor is constituted of the patterned silicon film having the hemi-spherical silicon grains formed on the surface thereof, the capacitor dielectric film covering the hemi-spherical silicon grains, and the capacitor plate covering the capacitor dielectric film.

The above and other objects, features and advantages of the present invention will be apparent from the following description of preferred embodiments of the invention with reference to the accompanying drawings.

DESCRIPTION OF THE PREFERRED EMBODIMENTS

Before explaining the process in accordance with the present invention, the HSG forming process based on the "crystal nucleation", which has been conducted by the co-inventors of the present application, will be described with reference to FIGS. 1 and 2.

Figure 1:
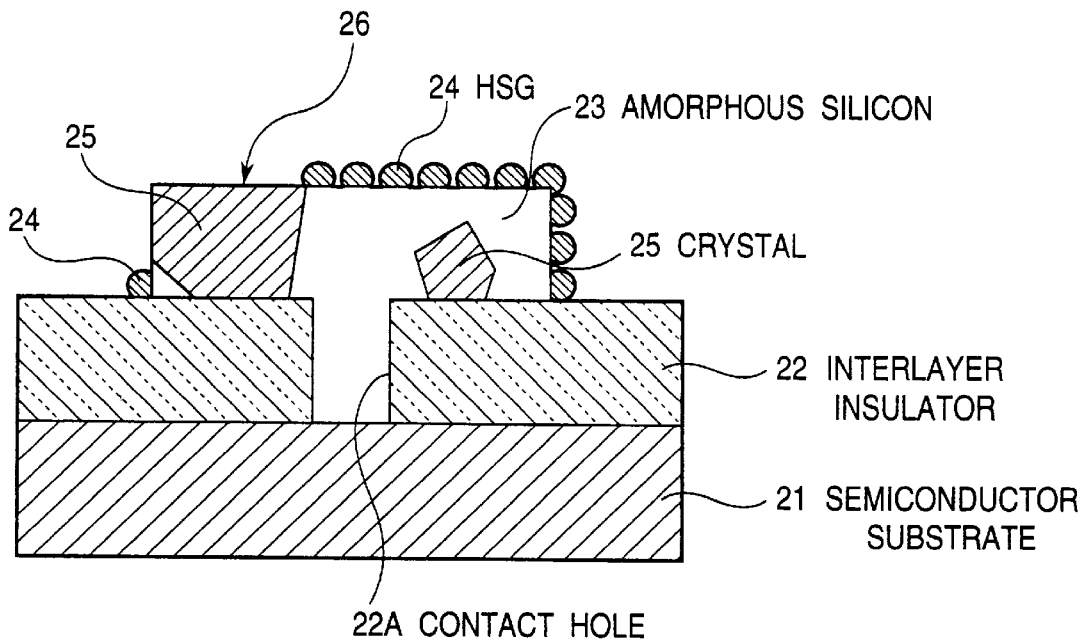
FIG. 1 is a diagrammatic section view of the capacitor lower plate formed in accordance with the temperature sequence as shown in FIG. 2.

Referring to FIG. 1, a capacitor lower plate to be formed with hemi-spherical grains is designated with Reference Numeral 26. In the example shown in FIG. 1, the capacitor lower plate 26 is a patterned amorphous silicon film. On a semiconductor substrate 21 having for example MOSFETs (not shown) previously formed therein for the purpose of forming memory cells, an interlayer insulator film 22 is formed, and a contact hole 22A is selectively formed to penetrate through the interlayer insulator film 22 and to partially expose the semiconductor substrate 21. For example, the interlayer insulator film 22 is formed of BPSG (borophosphosilicate glass) or NSG (non-doped silicate glass).

In this condition, an impurity-doped, for example, phosphorus-doped, amorphous silicon 23 is formed to fill the contact hole 22A and to cover the interlayer 22, and then, is patterned to have an exposed side surface and an exposed top surface. Incidentally, in the case that hemi-spherical grains are formed in accordance with the "crystal nucleation" process, it is not preferred that a natural oxide film covers the surface of the amorphous silicon film 23. Therefore, if the surface of the amorphous silicon film 23 is covered with the natural oxide film, the natural oxide film is removed by an etching or the like.

Figure 2:
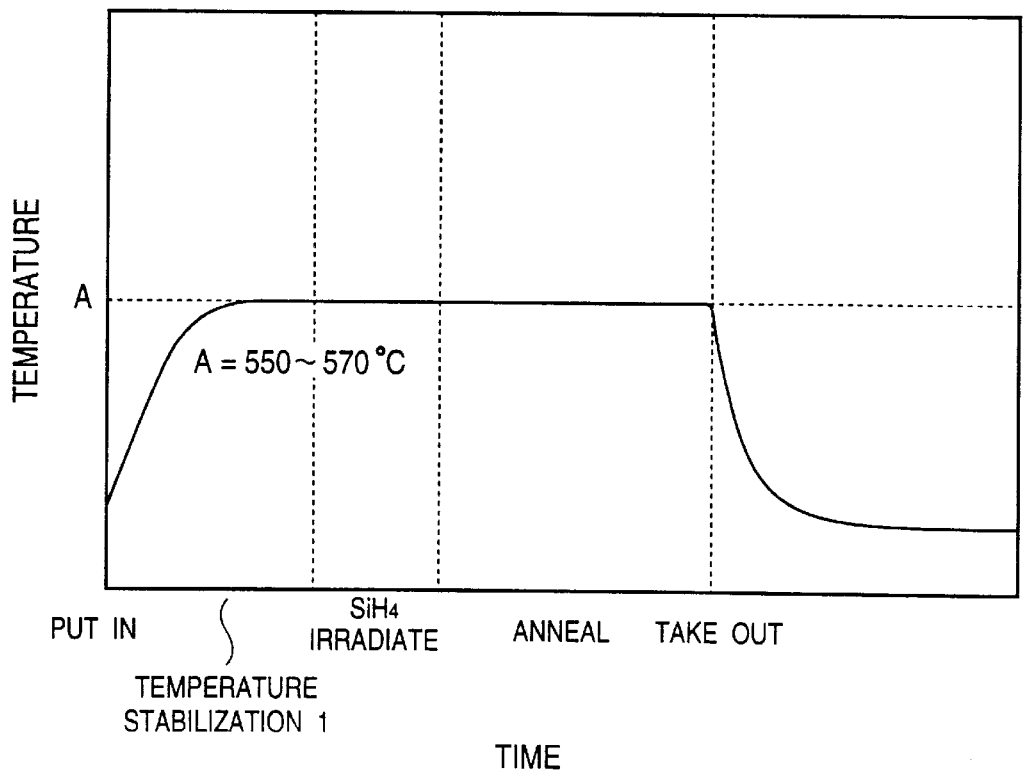
FIG. 2 is a graph showing the temperature sequence, for illustrating the prior art process for forming the HSG structure capacitor lower plate.

The semiconductor substrate thus prepared is introduced into a reaction chamber, and a treatment is conducted at a temperature shown in FIG. 2 which illustrate a temperature sequence for processing the semiconductor substrate. As shown in FIG. 2, the semiconductor substrate is heated to a temperature of about 550° C. to 570° C., and then, is maintained at this temperature. After a temperature of the semiconductor substrate is stabilized at this temperature, $SiH_4$ is introduced into the reaction chamber, so that $SiH_4$ is irradiated onto the amorphous silicon film for a predetermined constant period of time. As a result, nuclei composed of silicon atoms are formed on the exposed top surface and the exposed side surface of the patterned amorphous silicon film.

After the nuclei have been formed, irradiation of $SiH_4$ is stopped, and the patterned amorphous silicon film is annealed at the same temperature for another predetermined period of time. In this annealing process, on the exposed top surface and the exposed side surface of the patterned amorphous silicon film, migration of amorphous silicon occurs so that silicon atoms in the neighborhood of each nucleus aggregate or flocculate toward each nucleus, with the result that hemi-spherical silicon crystalline grains are formed on the exposed top surface and the exposed side surface of the patterned amorphous silicon film. Thereafter, the semiconductor substrate having the thus formed hemi-spherical silicon crystalline grains is taken out from the reaction chamber. Thereafter, a dielectric film and a common plate electrode (both not shown) are formed, and thus, a capacitor is completed.

In the case of adopting the temperature sequence mentioned above, the phenomenon was found out that, a crystal, different from the hemi-spherical grains, grows from a boundary between the amorphous silicon and the interlayer insulator, and if the crystal reaches a top surface and a side surface of the amorphous silicon, no hemi-spherical grain is formed on a surface of the crystallized portion.

Now, this phenomenon will be described in detail with reference to FIG. 1. When the $SiH_4$ irradiaton and the annealing are conducted for the semiconductor substrate as shown in FIG. 1 in accordance with the temperature sequence as shown in FIG. 2, it was found out that, before hemi-spherical silicon crystalline grains 24 are formed on the surface of the patterned amorphous silicon film 23, a crystal 25 grows from the boundary between the interlayer insulator film 22 and the amorphous silicon film 23.

It was also observed that, if the crystal 25 reaches the surface of the amorphous silicon film 23 before the hemi-spherical grains 24 are formed on the surface of the amorphous silicon film 23, the hemi-spherical grains 24 was not formed on the surface of the crystallized portion, as shown by Reference Numeral 26. As a result, the increase of the surface area by the HSG formation is substantially restricted.

The co-inventors of the present application found out that the crystallization of the amorphous silicon starting from the boundary between the amorphous silicon and the interlayer insulator film can be suppressed or retarded by changing the temperature sequence. On the basis of this finding, the co-inventors of the present application propose here an improved process for forming a capacitor component.

Now, a first embodiment of the process in accordance with the present invention for forming a capacitor component, which can be used as a cell capacitor for the stacked capacitor structure DRAM memory cell, will be described with reference to FIGS. 3, 4, 5 and 6.

Figure 3:
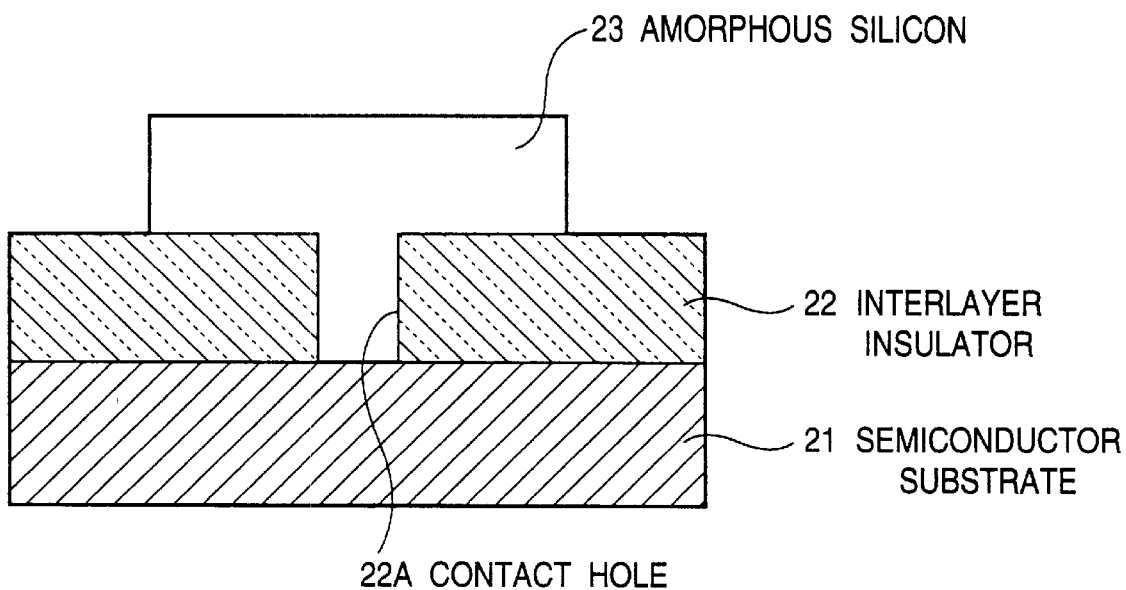
FIG. 3 is a diagrammatic section view of the capacitor lower plate to be treated in accordance with the temperature sequence of the process in accordance with the present invention for forming the HSG structure capacitor lower plate.

FIG. 3 illustrates a condition in which on a semiconductor substrate 21 (having for example MOSFTs (not shown) previously formed therein for the purpose of forming memory cells), there are formed an interlayer insulator film 22 (which is formed of for example BPSG or NSG) having a contact hole 22A selectively formed to penetrate through the interlayer insulator film 22 and to partially expose the semiconductor substrate 21, and a patterned phosphorus-doped amorphous silicon 23 formed to fill the contact hole 22A and to partially cover the interlayer 22 and to have an exposed side surface and an exposed top surface. The semiconductor substrate thus prepared is introduced into a reaction chamber.

Figure 4:
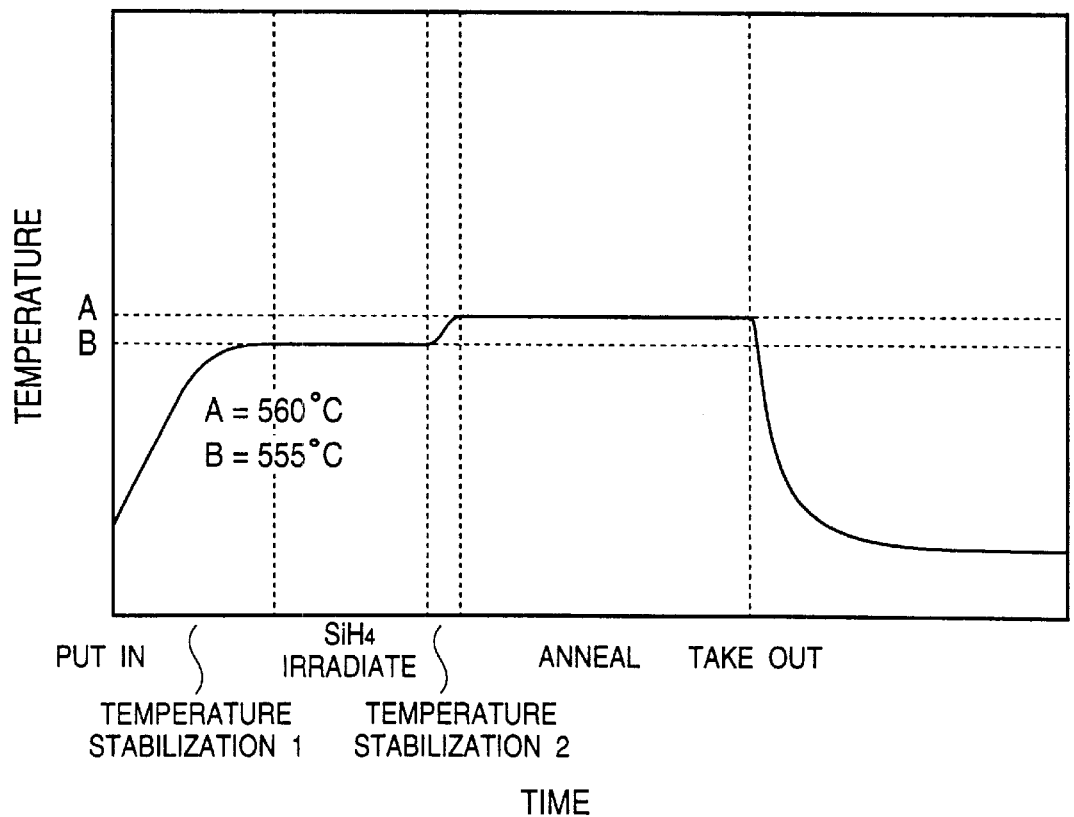
FIG. 4 is a graph showing the temperature sequence of a first embodiment of the process in accordance with the present invention for forming the HSG structure capacitor lower plate.

After the semiconductor substrate is introduced into the reaction chamber, a treatment for the HSG formation is performed in accordance with the temperature sequence as shown in FIG. 4. First, the semiconductor substrate is heated to a temperature B of about 555° C. (which is lower than an annealing temperature A of about 560° C. by 5° C.) ("TEMPERATURE STABILIZATION 1" in FIG. 4). After the temperature of the semiconductor substrate is stabilized at the temperature B, $SiH_4$ is introduced into the reaction chamber as a gas for forming crystal nuclei composed of silicon atoms, so that $SiH_4$ is irradiated onto the phosphorus-doped amorphous silicon film 23. Introduction of $SiH_4$ is performed for 20 minutes for example. In addition, the reaction chamber is maintained at a vacuum degree of for example 0.11997 Pa (0.9 mTorr) during a period of time in which $SiH_4$ is introduced. Thus, during the period of introducing $SiH_4$, crystal nuclei composed of silicon atoms are formed on the exposed side surface and the exposed top surface of the patterned amorphous silicon film 23.

In the case that $SiH_4$ was irradiated at the stabilized temperature B which is lower than the annealing temperature A by not less than 5° C. as mentioned above, a growth rate of the crystal starting from the boundary between the amorphous silicon film 23 and the interlayer insulator film 22 and growing in the amorphous silicon film 23, could be made low, namely, the growth could be retarded.

After irradiation of $SiH_4$, the temperature of the semiconductor substrate is elevated to the temperature A of about 560° C. At this time, a transient time of about five minutes is required until the temperature of the semiconductor substrate has been stabilized at the temperature A ("TEMPERATURE STABILIZATION 2" in FIG. 4). If the temperature of the semiconductor substrate is put in the stabilized temperature A, the semiconductor substrate starts to be annealed in the reaction chamber. Therefore, the temperature A indicates a stabilized temperature in the annealing step. This annealing was conducted for 35 minutes.

Figure 5:
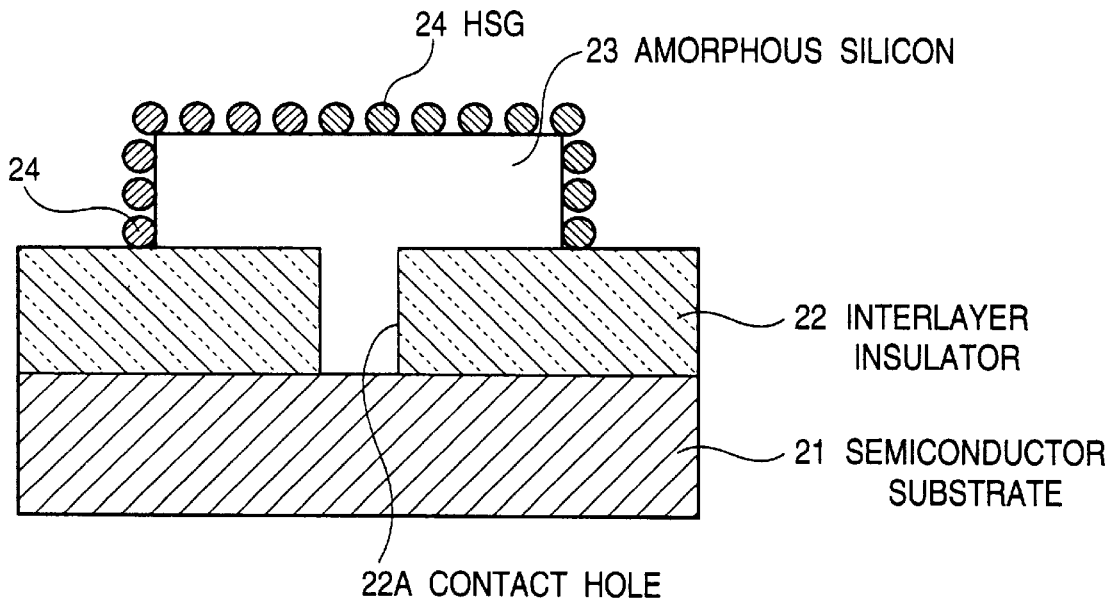
FIG. 5 is a diagrammatic section view of the capacitor lower plate on which the hemi-spherical grains are formed on the amorphous silicon film in accordance with the temperature sequence of the process in accordance with the present invention for forming the HSG structure capacitor lower plate.

In this annealing process, the crystal growth starting from the boundary between the amorphous silicon film 23 and the interlayer insulator film 22 did not reach the surface of the amorphous silicon film 23, and migration causing silicon atoms to aggregate toward each nucleus occurred over the whole surface of the amorphous silicon film 23. As a result, as shown in FIG. 5, hemi-spherical silicon crystalline grains 24 are uniformly formed on the whole surface of the top surface and the side surface of the amorphous silicon film 23. Thus, a capacitor lower plate, namely, a storage node plate, having a large surface area, could be formed. In fact, the capacitor lower plate formed in accordance with the above mentioned temperature sequence, had the surface area which is about 1.8 times to 2.5 times that of a capacitor lower plate having no hemi-spherical grains (HSG).

The semiconductor substrate formed with the hemi-spherical grains (HSG) by the above mentioned annealing process, is taken out from the reaction chamber, and then, is cooled down, and thereafter, is introduced into another reaction chamber (not shown).

Figure 6:
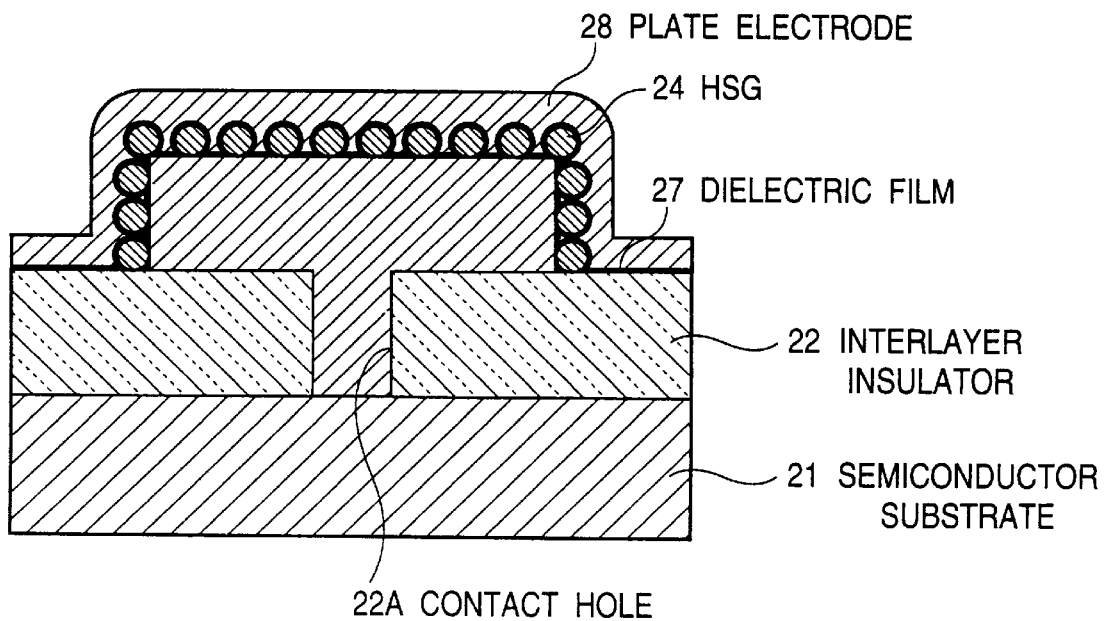
FIG. 6 is a diagrammatic section view of the HSG structure capacitor completed in accordance with the process in accordance with the present invention for forming the HSG structure capacitor lower plate.

In a succeeding processing, as shown in FIG. 6, a silicon oxide film or a silicon nitride film having a thickness of 5 nm to 8 nm is formed on the hemi-spherical grains 24 by a conventional process, so as to form a dielectric film 27 of the capacitor. Furthermore, a polysilicon film is deposited to cover the dielectric film 27 to form a capacitor upper plate, namely, a common plate electrode 28. Thus, a capacitor is constituted of the lower plate 22 having the hemi-spherical grains 24, the dielectric film 27 and the upper plate 28. Incidentally, if a heat treatment is conducted after formation of the hemi-spherical grains (HSG), the amorphous silicon 23 becomes polysilicon.

Figure 7:
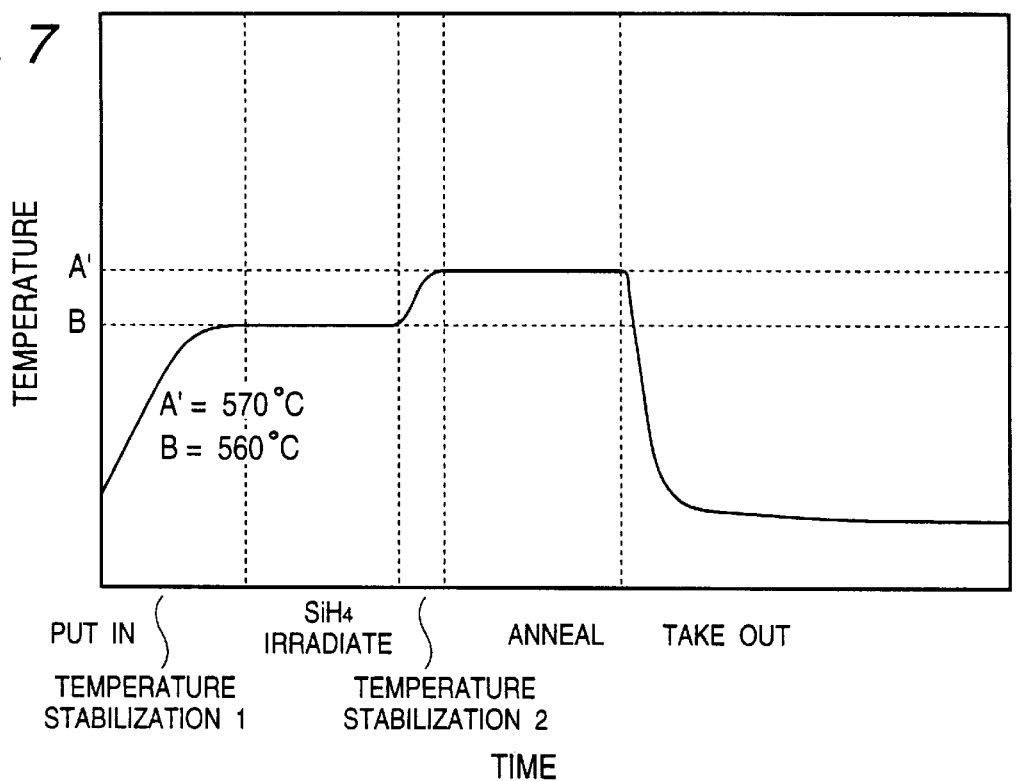
FIG. 7 is a graph showing the temperature sequence of a second embodiment of the process in accordance with the present invention for forming the HSG structure capacitor lower plate.

Referring FIG. 7, there is shown a temperature sequence illustrating a second embodiment of the process in accordance with the present invention for forming the HSG structure capacitor lower plate.

Aa seen from comparison between FIGS. 4 and 7, the second embodiment is characterized in that the annealing temperature A' in the annealing step is set to 570° C., which is somewhat higher than that of the first embodiment, and the stabilized temperature B at the time of irradiating $SiH_4$ is set to 560° C., which is lower than the annealing temperature A' by 10° C. In the time sequence shown in FIG. 7, the $SiH_4$ irradiating time and the annealing time were about 15 minutes and about 20 minutes, respectively.

As seen from the second embodiment, although the stabilized temperature B at the time of irradiating $SiH_4$ and the annealing temperature A' are made higher than those in the first embodiment, it was possible to prevent a crystal growing in the amorphous silicon from reaching the surface of the amorphous silicon film before the hemi-spherical grains are formed on the whole exposed surface of the amorphous silicon film, similarly to the first embodiment.

On the other hand, as shown in FIG. 7, if the stabilized temperature B at the time of irradiating $SiH_4$ and the annealing temperature A' are made higher than those in the first embodiment, the crystal nucleus formation processing time and the annealing time can be shortened in comparison with the first embodiment, and furthermore, the throughput can be improved.

Now, a temperature sequence of a third embodiment of the process in accordance with the present invention for forming the HSG structure capacitor lower plate, will be described with reference to FIG. 8. This third embodiment is characterized in that the temperature is caused to change over three steps from the moment the semiconductor substrate is introduced into the reaction chamber to the moment the annealing is completed.

First, the semiconductor substrate is heated to a temperature C of about 550° C., which is lower than by 5° C. the stabilized temperature B of about 555° C. at the time of irradiating $SiH_4$, and after the temperature of the semiconductor substrate is stabilized at the temperature C, the semiconductor substrate is heated to the stabilized temperature B for irradiating $SiH_4$, and stabilized at the temperature B. During a period that the temperature of the semiconductor substrate is maintained at the stabilized temperature B, $SiH_4$ is introduced and irradiated. After the irradiation of $SiH_4$, the semiconductor substrate is heated to elevate by 5° C. to reach the anneal temperature A of about 560° C.

As seen from the above, the third embodiment is characterized in that the semiconductor substrate is preliminary heated before the irradiation of $SiH_4$, with the result that the semiconductor substrate can be easily heated to the stabilized temperature B for the crystal nucleus formation processing. Therefore, it is considered that the temperature C is lower than the stabilized temperature B by a value preferably not less than 5° C. but not greater than 10° C. so that the semiconductor substrate can be easily heated to the crystal nucleus formation processing temperature.

In general, the crystallization rate of amorphous silicon becomes exponentially quick if the temperature exceeds a certain temperature. In the examples shown in FIGS. 2, 4 and 7, about 30 minutes are required until it reaches the temperature B for the $SiH_4$ irradiation, namely, as the period of "TEMPERATURE STABILIZATION 1", and in this period of time, in fact, crystallization advances in the amorphous silicon 23.

Figure 8:
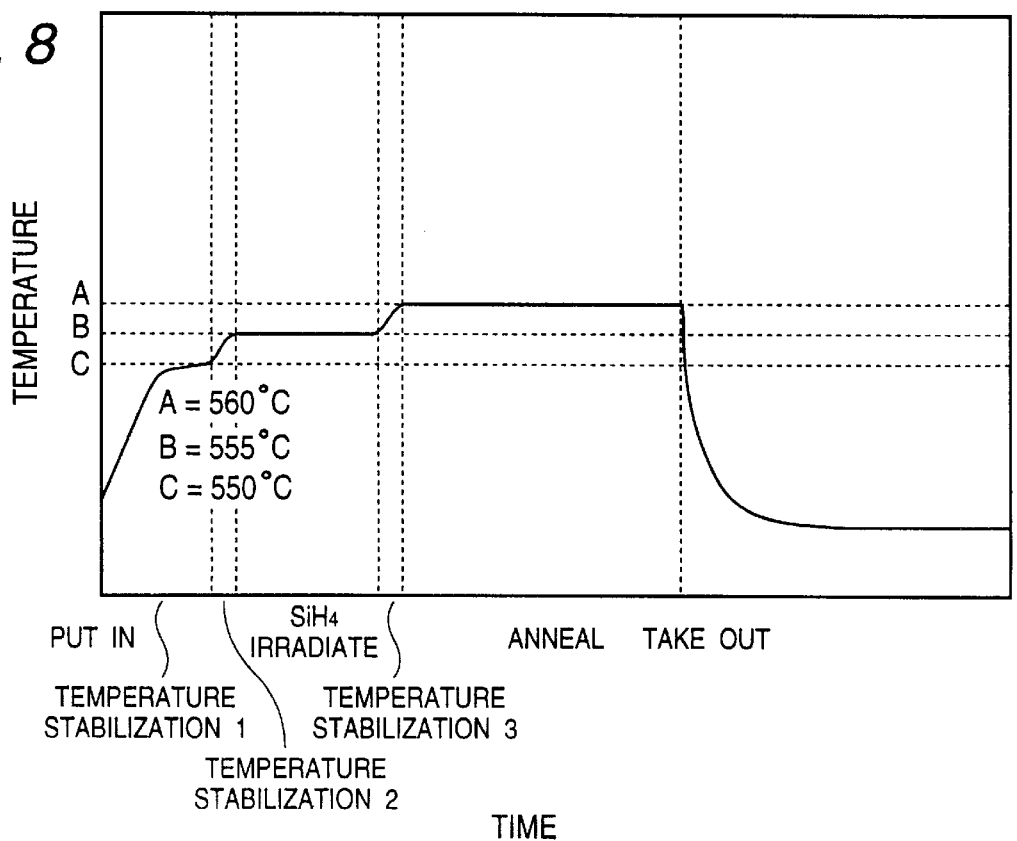
FIG. 8 is a graph showing the temperature sequence of a third embodiment of the process in accordance with the present invention for forming the HSG structure capacitor lower plate.

In the process shown in FIG. 8, since the temperature of the semiconductor substrate is stabilized once at the temperature C lower than the temperature B before the temperature of the semiconductor substrate is brought to the crystal nucleus formation processing temperature B, the crystallization of amorphous silicon can be retarded. On the other hand, since a difference between the temperature C and the temperature B is small, the period of timing ("TEMPERATURE STABILIZATION 2" in FIG. 8) for elevating and stabilizing the temperature at the temperature B can be shortened to about five minutes. Accordingly, this process can further retard the crystal growth in comparison with the examples shown in FIGS. 2, 4 and 7.

Figure 9:
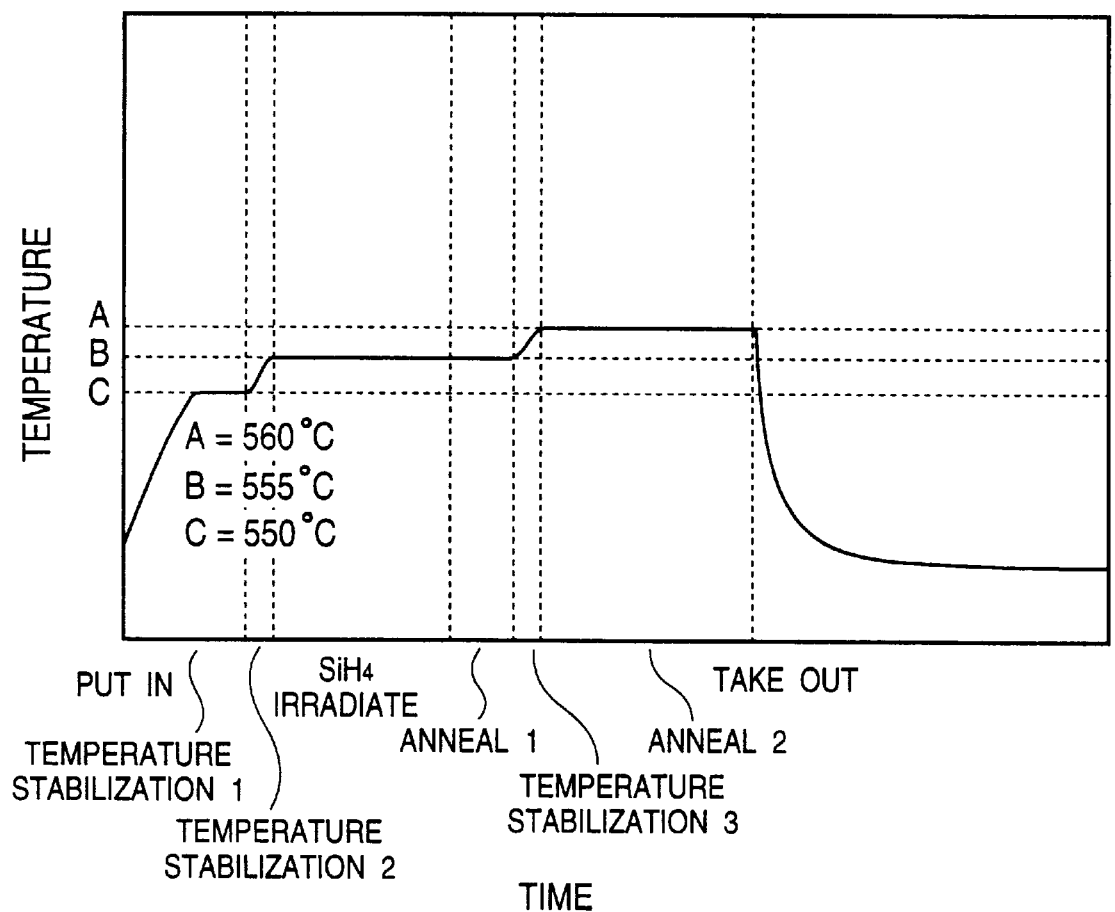
FIG. 9 is a graph showing the temperature sequence of a first embodiment of the process in accordance with the present invention for forming the HSG structure capacitor lower plate.

Next, a temperature sequence of a fourth embodiment of the process in accordance with the present invention for forming the HSG structure capacitor lower plate, will be described with reference to FIG. 9. This fourth embodiment is characterized in that the temperature is caused to change over two steps in the annealing process. First, in an "ANNEAL 1", the semiconductor substrate is annealed at the same temperature as that the stabilized temperature B for irradiating $SiH_4$, for about ten minutes, and succeedingly, in an "ANNEAL 2", the semiconductor substrate is heated to elevate by 5° C. to reach the annealing temperature A, and thereafter, the semiconductor substrate is annealed at the temperature A for about 25 minutes.

In general, crystals in the amorphous silicon become large with the lapse of time, and the higher the temperature is, the higher the crystal growth rate becomes. On the other hand, the grain diameter increasing rate or speed of the hemi-spherical silicon crystalline grains 24 lowers with the lapse of time.

The reason for this is considered as follows: Because of migration, the silicon atoms are supplied to each crystal nucleus from the amorphous silicon 23. The higher the temperature is, the larger the supply amount becomes. Here, assuming that the temperature is at constant, the supply amount is also at constant per time. Silicon atoms are deposited on a surface of the hemi-spherical silicon crystalline grains because of the migration, with the result that the size or diameter of the hemi-spherical silicon crystalline grains becomes large. Therefore, if the supply amount of silicon atoms is at constant, the grain diameter increasing rate or speed lowers with an increase of the surface area of the hemi-spherical silicon crystalline grains 24. Thus, the grain diameter increasing rate or speed of the hemi-spherical silicon crystalline grains 24 lowers with the lapse of time.

Accordingly, in the fourth embodiment, in the "ANNEAL 1", the HSG formation is caused to advance while maintaining the crystal growth rate at a low level, and if the grain diameter of the hemi-spherical silicon crystalline grains 24 becomes large to some degree, the anneal is transited to the "ANNEAL 2" so that the temperature is elevated to the temperature A. If the temperature is elevated to the temperature A, since the supply amount of silicon atoms increases, the growth of the hemi-spherical silicon crystalline grains 24 is accelerated so that the grains 24 can be further enlarged.

As seen from the above, by setting the stabilized temperature B for irradiating $SiH_4$ at a temperature lower than the annealing temperature A or A', advancement of the crystallization in the amorphous silicon, starting from the boundary between the amorphous silicon and the interlayer insulator film, can be suppressed or retarded during the process of the $SiH_4$ irradiation, namely during the crystal nucleus formation process. According to experiments, it was found that, if the annealing temperature is not higher than 600° C. and the stabilized temperature B for irradiating the crystal nucleus forming gas is not lower than 530° C. and but is lower than the annealing temperature by not less than 5° C., the crystals growing into the amorphous silicon from the boundary between the amorphous silicon and the interlayer insulator does not reach the surface of the amorphous silicon film in the annealing process.

As would be apparent from the above mentioned description, since the crystal growth greatly depends upon both the temperature and the lapse of time. In addition, the crystals growing from the boundary between the amorphous silicon and the interlayer insulator continues to grow in the amorphous silicon over the whole period of the crystal nucleus formation process and the annealing process for forming the hemi-spherical grains. Therefore, during the crystal nucleus formation process, the crystals starts to grow from the boundary between the amorphous silicon and the interlayer insulator and continues to grow in the amorphous silicon, but although the silicon nuclei are formed on the surface of the amorphous silicon, the hemi-spherical grains do not grow from the silicon nuclei. Therefore, it is important to suppress or retard, during the crystal nucleus formation process, the growth of the crystals growing in the amorphous silicon from the boundary between the amorphous silicon and the interlayer insulator, at such a degree which can prevent the crystals from reaching the surface of the amorphous silicon before the hemi-spherical grains are uniformly formed on the whole exposed surface of the amorphous silicon in the annealing process.

On the other hand, when the stabilized temperature B for irradiating the crystal nucleus forming gas is lower than 530° C., the crystal nuclei formed of silicon atoms could not be formed on the surface of the amorphous silicon film. When the annealing temperature A is higher than 600° C., a crystal generates in the inside of the amorphous silicon film, and it is no longer possible to control the growth of the crystal in the amorphous silicon film. Furthermore, it was found that, if the stabilized temperature B for irradiating the crystal nucleus forming gas is lower than the annealing temperature A by not less than 5° C., although crystals generate, the growth of the generated crystals can be sufficiently suppressed or retarded in the crystal nucleus forming process. However, it was also found that, when the stabilized temperature B for irradiating the crystal nucleus forming gas is lower than the annealing temperature A by less than 5° C., the crystals growing into the amorphous silicon from the boundary between the amorphous silicon and the interlayer insulator could not satisfactory be prevented from reaching the surface of the amorphous silicon film in the annealing process.

In the above mentioned embodiments, silane ($SiH_4$) was irradiated as a source gas for forming the crystal nuclei, but in place of the silane, disilane ($Si_2H_6$) or trisilane ($Si_3H_8$) can be used. In addition, as impurity doped into the amorphous silicon, As (arsenic) or B (boron) can be used in place of phosphorus.

As mentioned above, the process in accordance with the present invention can suppress or retard the growth of the crystals starting from the boundary between the amorphous silicon film and the interlayer insulator film and growing in the amorphous silicon film, in the process for forming the hemi-spherical silicon grains on the basis of the "crystal nucleation" process, with the result that it is possible to prevent formation of hemi-spherical silicon grains from being obstructed by the growth of the crystals growing in the amorphous silicon film. Accordingly, it is possible to form a capacitor lower plate having a large surface area The invention has thus been shown and described with reference to the specific embodiments. However, it should be noted that the present invention is in no way limited to the details of the illustrated structures but changes and modifications may be made within the scope of the appended claims.

What is claimed is:

1. A process of forming hemis-pherical silicon grains on a surface of amorphous silicon film, comprising the steps of:

irradiating a crystal nucleus forming gas onto said amorphous silicon film formed on an interlayer insulator film, at a first temperature of at least 530° C., for forming crystal nuclei on the surface of said amorphous silicon film; and annealing said amorphous silicon film having said crystal nuclei formed on the surface thereof, at a second temperature of 600° C. or less and that exceeds said first temperature by at least 5° C., for forming hemispherical silicon grains over an entire length of a top surface and side surfaces of said amorphous silicon film, wherein before said crystal nucleus forming gas is irradiated onto said amorphous silicon film at said first temperature, said amorphous silicon film is preliminary heated to and maintained at a third temperature which is lower than said first temperature by a temperature difference which is not less than 5° C. but not greater than 10° C., and thereafter, said amorphous silicon film is heated to and maintained at said first temperature, and said crystal nucleus forming gas is irradiated onto said amorphous silicon film at said first temperature.

2. A process for forming a capacitor on an interlayer insulator film, said capacitor being electrically connected to a semiconductor substrate through a contact hole formed through the interlayer insulator film, the process comprising the steps of:

forming a patterned amorphous silicon film to completely fill said contact hole and to partially cover said interlayer insulator film;

irradiating a crystal nucleus forming gas onto said patterned amorphous silicon film at a first temperature of at least 530° C. to form crystal nuclei on a surface thereof, wherein the growth rate of crystals at the first temperature, growing from a boundary between said patterned amorphous silicon film and said interlayer insulator film, is lower than a growth rate of the crystals at a second temperature of 600° C. or less and that exceeds said first temperature by at least 5° C. in a succeeding annealing step, wherein before said crystal nucleus forming gas is irradiated onto said amorphous silicon film at said first temperature, said amorphous silicon film is preliminary heated to and maintained at a third temperature which is lower than said first temperature, and thereafter, said amorphous silicon film is heated to and maintained at said first temperature, and said crystal nucleus forming gas is irradiated onto said amorphous silicon film at said first temperature;

annealing said patterned amorphous silicon film at said second temperature so that hemi-spherical silicon grains are formed from the crystal nuclei over an entire top surface and side surfaces of said patterned amorphous silicon film;

forming a capacitor dielectric film to cover said hemi-spherical silicon grains; and forming a capacitor plate to cover said capacitor dielectric film, wherein said capacitor is comprised of said patterned amorphous silicon film having said hemi-spherical silicon grains, said capacitor dielectric film, and said capacitor plate.

3. A process claimed in claim 2 wherein before said crystal nucleus forming gas is irradiated onto said amorphous silicon film at said first temperature, said amorphous silicon film is preliminary heated to and maintained at a third temperature which is lower than said first temperature, and thereafter, said amorphous silicon film is heated to and maintained at said first temperate, and said crystal nucleus forming gas is irradiated onto said amorphous silicon film at said first temperature.

4. A process claimed in claim 2 wherein said third temperature is lower than said first temperature by a temperature difference which is not less than 5° C. but not greater than 10° C.

5. A process claimed in claim 2 wherein said annealing is conducted at an initial stage at a temperature lower than a temperature of a final stage of said annealing.

6. A process for forming a capacitor on an interlayer insulator film, said capacitor being electrically connected to a semiconductor substrate through a contact hole formed through the interlayer insulator film, the process comprising the steps of:

forming a patterned amorphous silicon film to completely fill said contact hole and to partially cover said interlayer insulator film;

irradiating a crystal nucleus forming gas onto said patterned amorphous silicon film at a first temperature to form crystal nuclei on a surface thereof, wherein the growth rate of crystals at the first temperature, growing from a boundary between said patterned amorphous silicon film and said interlayer insulator film, is lower than a growth rate of the crystals at a second temperature in a succeeding annealing step;

annealing said patterned amorphous silicon film at an initial temperature equal to said second temperature and a final temperature higher than said initial temperature so that hemi-spherical silicon grains are formed from the crystal nuclei on said surface of said patterned amorphous silicon film;

forming a capacitor dielectric film to cover said hemi-spherical silicon grains; and forming a capacitor plate to cover said capacitor dielectric film, wherein said capacitor is comprised of said patterned amorphous silicon film having said hemispherical silicon grains, said capacitor dielectric film, and said capacitor plate.

* * * * *